United States Patent [19]

Nonaka et al.

[11] Patent Number: 5,047,733
[45] Date of Patent: Sep. 10, 1991

[54] PLL SYNTHESIZER PROVIDING RAPID FREQUENCY CHANGEOVER

[75] Inventors: Kazuyuki Nonaka; Takehiro Akiyama; Kouzi Takekawa, all of Kasugai, Japan

[73] Assignees: Fujitsu Limited, Kawasaki; Fujitsu VLSI Limited, Kasugai, both of Japan

[21] Appl. No.: 454,589

[22] Filed: Dec. 21, 1989

[30] Foreign Application Priority Data

Dec. 28, 1988 [JP] Japan .................................. 63-332371

[51] Int. Cl.$^5$ .......................................... H03L 7/093
[52] U.S. Cl. ...................................... 331/14; 331/16; 331/17; 331/25; 331/36 C; 331/117 R; 331/177 V
[58] Field of Search .................... 331/14, 17, 8, 25, 16

[56] References Cited

U.S. PATENT DOCUMENTS

| | | | |
|---|---|---|---|
| 4,516,083 | 5/1985 | Turney | 331/17 X |
| 4,745,372 | 5/1988 | Miwa | 331/14 X |
| 4,752,749 | 6/1988 | Moger | 331/17 |

FOREIGN PATENT DOCUMENTS 2356332 1/1978 France .
WO81/02497 9/1981 PCT Int'l Appl. .

OTHER PUBLICATIONS

Grundig Technische Informationen, vol. 28, No. 1/2, 1981, pp. 7–9, R. Lehmann: "Der Synthesizerbaustein im ST 6000".

Primary Examiner—Siegfried H. Grimm
Attorney, Agent, or Firm—Armstrong, Nikaido, Marmelstein, Kubovcik & Murray

[57] ABSTRACT

A PLL synthesizer includes a voltage-controlled oscillator generating an output signal having a frequency based on a first signal supplied thereto, a PLL control circuit which generates a second signal based on the output signal and a set frequency, a lowpass filter having an input terminal and an output terminal, for filtering the second signal supplied through the input terminal to thereby generate the first signal supplied to the voltage-controlled oscillator through the output terminal, and a switch circuit which is coupled between the input and output terminals of the lowpass filter and which supplies the second signal directly to the voltage-controlled oscillator during a predetermined time when the set frequency is changed.

17 Claims, 8 Drawing Sheets

PLL SYNTHESIZER PROVIDING RAPID FREQUENCY CHANGEOVER

BACKGROUND OF THE INVENTION

The present invention generally relates to a PLL synthesizer, and more particularly to a PLL synthesizer which controls the frequency of an output signal so as to be always equal to a desired frequency. The present invention is suitable for a digital tuner, for example.

A PLL (phase-locked loop) synthesizer is a feedback circuit which functions to make the frequency of an output signal equal to a desired frequency. In general, a lowpass filter is provided in the PLL loop to improve the purity of the output signal derived from the PLL synthesizer. When the desired frequency is changed to a different frequency, it takes a lock-up time for the frequency of the PLL synthesizer to be settled at the different frequency.

FIG. 1 is a block diagram of a conventional PLL synthesizer. The PLL synthesizer is supplied with a clock signal CK, set frequency data DA, and a strobe signal STB, all of which are derived from an external circuit (not shown). When the strobe signal STB is supplied to the PLL synthesizer while the set frequency data DA is being input thereto, the set frequency data DA is written into a PLL operation circuit 1 in synchronism with the clock signal CK. The PLL operation circuit 1 divides the set frequency data DA on the basis of a reference frequency generated by a crystal oscillator 2 and thereby generates a set signal fr, which is supplied to a phase comparator 3. The PLL operation circuit 1 is supplied with a signal supplied from a prescaler circuit (frequency divider) 7. The signal from the prescaler circuit 7 is frequency-divided by the PLL operation circuit 1 so that a feedback signal fp to be supplied to the phase comparator 3 is generated.

The phase comparator 3 generates pulse signals $\phi r$ and $\phi p$ which are based on the frequencies of the set signal fr and the feedback signal fp as well as the phase difference therebetween as shown in (A) and (B) of FIG. 2. The charge pump circuit 4 derives a signal SG1 as shown in (C) of FIG. 2 from the pulse signals $\phi r$ and $\phi p$. The signal SG1 contains pulse components on a DC component thereof. This DC component of the signal SG1 is increased or decreased in response to fluctuations of the frequencies of the pulse signals $\phi r$ and $\phi p$. The pulse components contained in the signal SG1 are varied on the basis of the phase difference between the pulse signals $\phi r$ and $\phi p$. When the phase of the pulse signal $\phi p$ lags behind the phase of the pulse signal $\phi r$, a high component PH out of the pulse components contained in the signal SG1 is large. On the other hand, when the phase of the pulse signal $\phi p$ leads the phase of the pulse signal $\phi r$, a low component PL out of the pulse components contained in the signal SG1 is large.

The lowpass filter 5 smooths the signal SG1 derived from the charge pump circuit 4 and eliminates the pulse components from the signal SG1. Thereby, a signal SG2 having no pulse components is generated by the lowpass filter 5. The signal thus formed is supplied to a voltage-controlled oscillator (hereinafter simply referred to as a VCO) 6, which generates an output signal SG3 having a frequency based on the voltage of the signal SG2 supplied from the lowpass filter 5. The output signal SG3 is supplied to the prescaler circuit 7, which divides the frequency of the output signal SG3. The signal derived from the prescaler circuit 7 is further frequency-divided by the PLL operation circuit 1 so that the aforementioned feedback signal fp is generated.

When the set frequency data DA indicating a frequency F1 at present is changed so as to indicate a frequency F2 higher than the frequency F1, the PLL synthesizer shown in FIG. 1 operates as shown in FIG. 3. In response to the strobe signal STB shown in (A) of FIG. 3, the frequency fr1 of the set signal fr output from the PLL operation circuit 1 is increased to a frequency fr2 as shown in (B) of FIG. 3. In response to this change of the frequency, as shown in (C) of FIG. 3, the DC component of the signal SG1 output from the charge pump circuit 4 is increased, and the voltage of the signal SG2 is also increased as shown in (D) of FIG. 3. In response to this change of the signal SG2, the frequency of the output signal SG3 derived from the VCO 6 is changed from the frequency F1 to the frequency F2 as shown in (E) of FIG. 3. The output signal SG3 is always fed back to the PLL operation circuit 1 through the prescaler circuit 7. Thus, the frequency of the feedback signal fp is adjusted so as to become equal to the frequency fr2. Adversely, when the frequency of the set signal fr is decreased, the DC component of the signal SG1 is decreased, and the feedback signal fp is adjusted that the frequency thereof becomes equal to the decreased frequency of the set signal fr. Thus, the PLL synthesizer can generate different frequencies by the use of a single crystal oscillator 2 with a stability approximately equal to that for the crystal oscillator 2. It is noted that the pulse components contained in the signal SG1 shown in (C) of FIG. 3 are omitted for the convenience' sake.

However, the aforementioned PLL synthesizer has disadvantages as described below. The signal output from the charge pump circuit 4 is supplied to the VCO 6 through the lowpass filter 5. Thus, the PLL synthesizer needs a lock-up time $t_1$ (FIG. 3-(E)) based on a time constant of the lowpass filter 5 until the frequency of the output signal SG3 is settled at the revised frequency F2 after the DC level of the output signal SG1 starts changing. In case where the PLL synthesizer shown in FIG. 1 is applied to a digital tuner, tuning is not available during the lock-up time $t_1$ and a noise is introduced in the output signal SG3.

When the PLL synthesizer is designed to decrease the time constant of the lowpass filter 5 to thereby reduce the lock-up time $t_1$, the pulse component contained in the signal SG1 derived from the charge pump circuit 4 is applied to the VCO 6 without being eliminated. This causes a deterioration of the output signal SG3 and degrades the purity of the output signal SG3.

SUMMARY OF THE INVENTION

It is a general object of the present invention to provide an improved PLL synthesizer in which the aforementioned disadvantages are eliminated.

A more specific object of the present invention is to provide a PLL synthesizer having a reduced lock-up time.

The above objects of the present invention are achieved by a PLL synthesizer comprising a voltage-controlled oscillator generating an output signal having a frequency based on a first signal supplied thereto; PLL controlling means for generating a second signal based on the output signal and a desired set frequency; lowpass filter means having an input terminal and an output terminal, for filtering the second signal supplied through the input terminal to thereby generate the first signal supplied to the voltage-controlled oscillator through the output terminal; and switch means, coupled between the input and output terminals of the lowpass filter means, for supplying the second signal directly to the voltage-controlled oscillator during a predetermined time when the desired set frequency is changed.

The aforementioned objects of the present invention are also achieved by a PLL synthesizer as claimed in 13: A PLL synthesizer comprising a voltage-controlled oscillator generating an output signal having a frequency based on a first signal supplied thereto; PLL controlling means for generating a second signal based on the output signal and a desired set frequency; first lowpass filter means having an input terminal and an output terminal, for filtering the second signal supplied through the input terminal to thereby generate a filtered second signal output through the output terminal; second lowpass filter means for filtering the filtered second signal to thereby generate the first signal; and switch means, coupled between the input and output terminals of the first lowpass filter means, for supplying the second signal from the PLL controlling means directly to the voltage-controlled oscillator during a predetermined time when the desired set frequency is changed.

Further objects, features and advantages of the present invention will become apparent from the following detailed description when read in conjunction with the accompanying drawings.

DESCRIPTION OF THE PREFERRED EMBODIMENTS

Figures 1, 2:
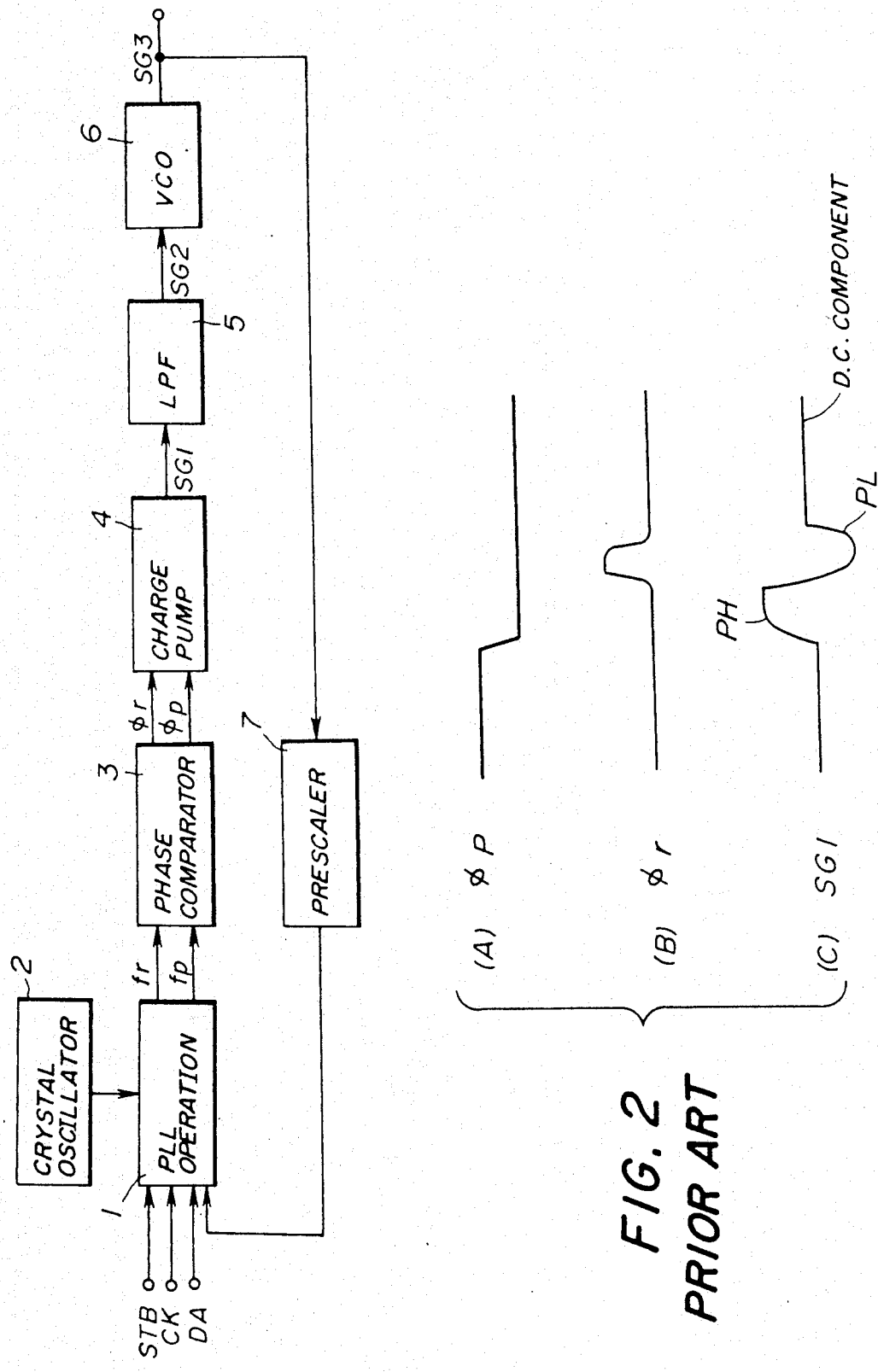
FIG. 1 is a block diagram of a conventional PLL synthesizer.
FIG. 2 is a waveform diagram of signals at different parts of the configuration shown in FIG. 1.
Figure 3:
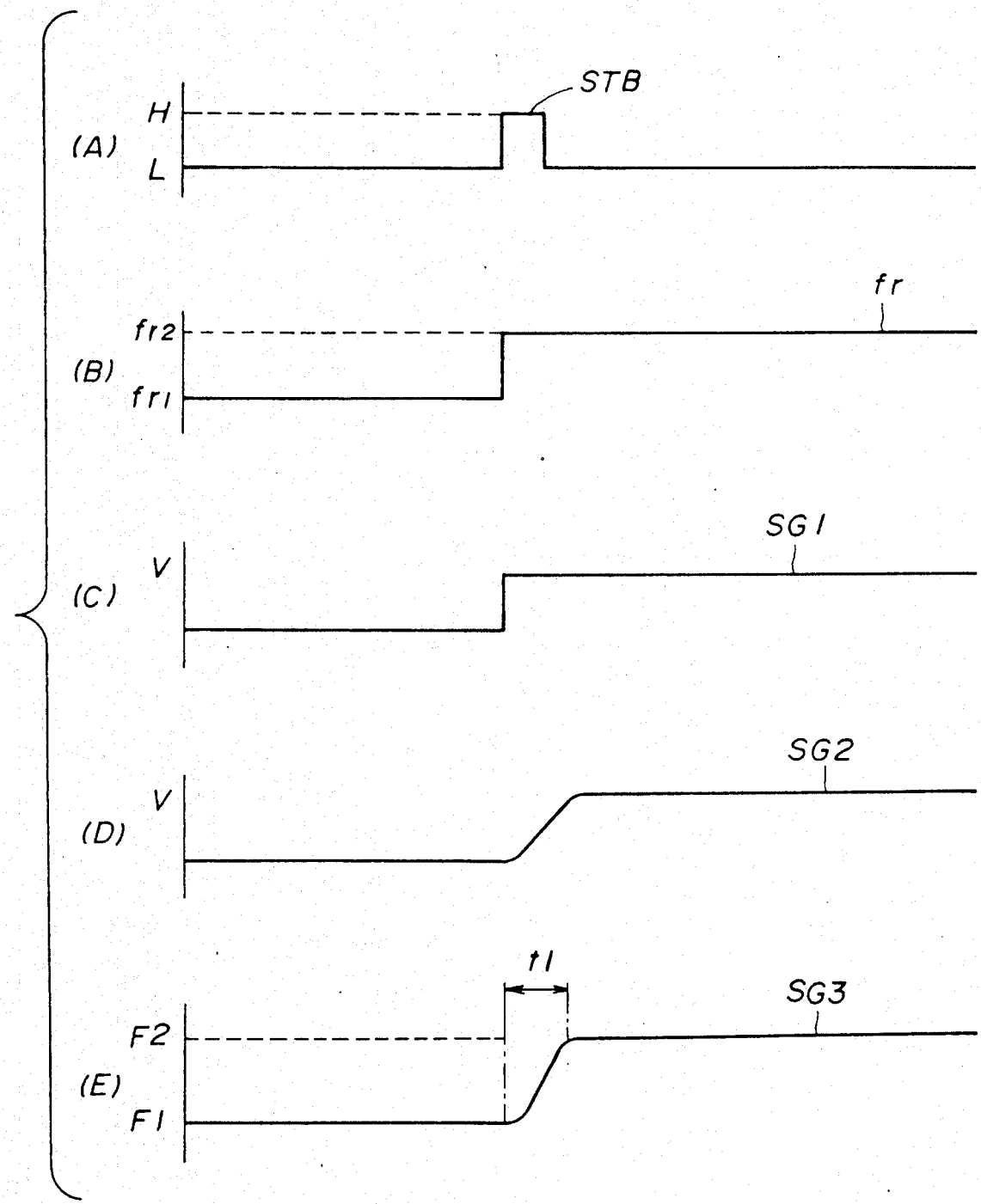
FIG. 3 is a waveform diagram of signals at different parts of the configuration shown in FIG. 1.
Figure 4:
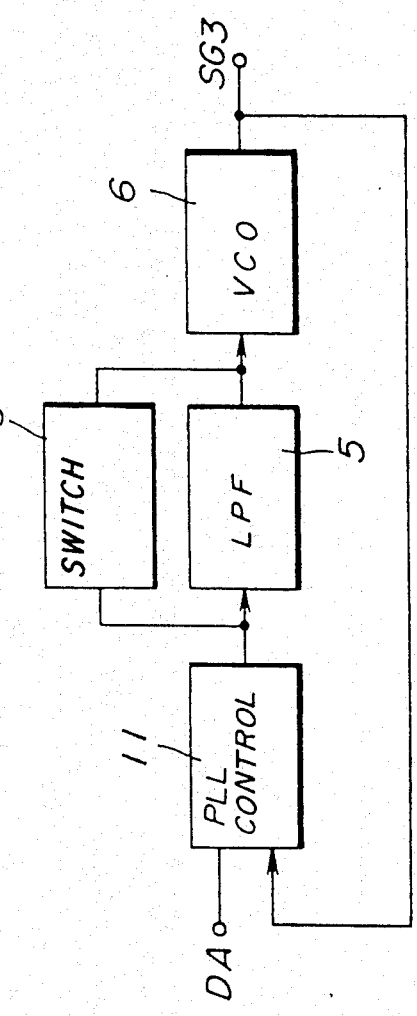
FIG. 4 is a block diagram of an outline of a preferred embodiment of the present invention.

Referring to FIG. 4, there is illustrated an outline of a preferred embodiment of the present invention. The PLL synthesizer according to the embodiment of the present invention is made up of a PLL control circuit 11, a lowpass filter 5, a switch circuit 8 and a voltage-controlled oscillator (VCO) 6. The PLL control circuit 11 is supplied with set frequency data supplied from an external circuit, and an output signal derived from the VCO 6. The PLL control circuit 11 corresponds to the combination of the aforementioned PLL operation circuit 1, the crystal oscillator 2, the phase comparator 3 and the charge pump circuit 4. A signal supplied from the PLL control circuit 11 is supplied to the lowpass filter 5 and the switch circuit 8. Normally, the switch circuit 8 is maintained open, and the signal from the PLL control circuit 11 passes through only the lowpass filter 5, and is then supplied to the VCO 6. When the set frequency data is changed so as to indicate a different frequency, the switch circuit 8 is closed so that the input and output terminals of the lowpass filter 5 are short-circuited. Thereby, the signal derived from the PLL control circuit 11 is supplied directly to the VCO 6 through the switch circuit 8. After a predetermined time has passed, the switch circuit 8 is made open so that the signal from the PLL control circuit 11 passes through only the lowpass filter 5. Thus, when the set frequency data DA is changed, the frequency derived from the VCO 6 is rapidly switched to a desired frequency without being affected by the time constant of the lowpass filter 5.

Figure 5:
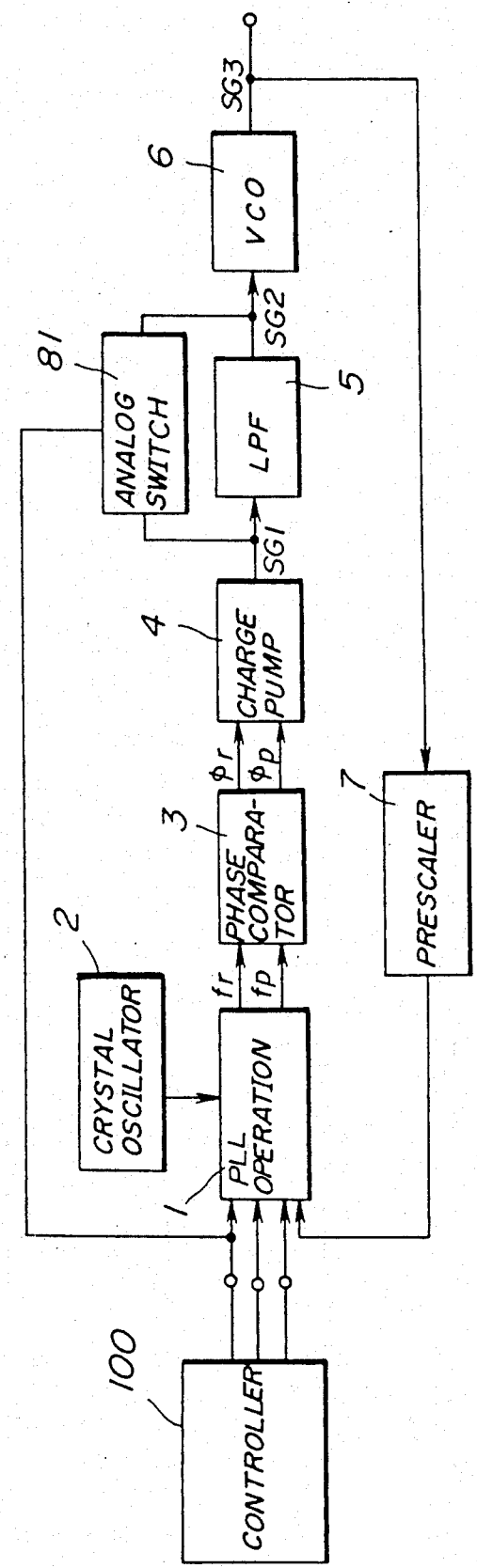
FIG. 5 is a block diagram of a detailed configuration of the embodiment shown in FIG. 4.

FIG. 5 is a block diagram of a detailed configuration of the PLL synthesizer shown in FIG. 4. In FIG. 4, those parts which are the same as those in the previous figures are given the same reference numerals. The switch circuit 8 shown in FIG. 4 is formed by an analog switch 81, which is controlled by the strobe signal STB supplied from a controller 100. The clock signal CK and set frequency data DA are also supplied from the controller 100.

Figure 6:
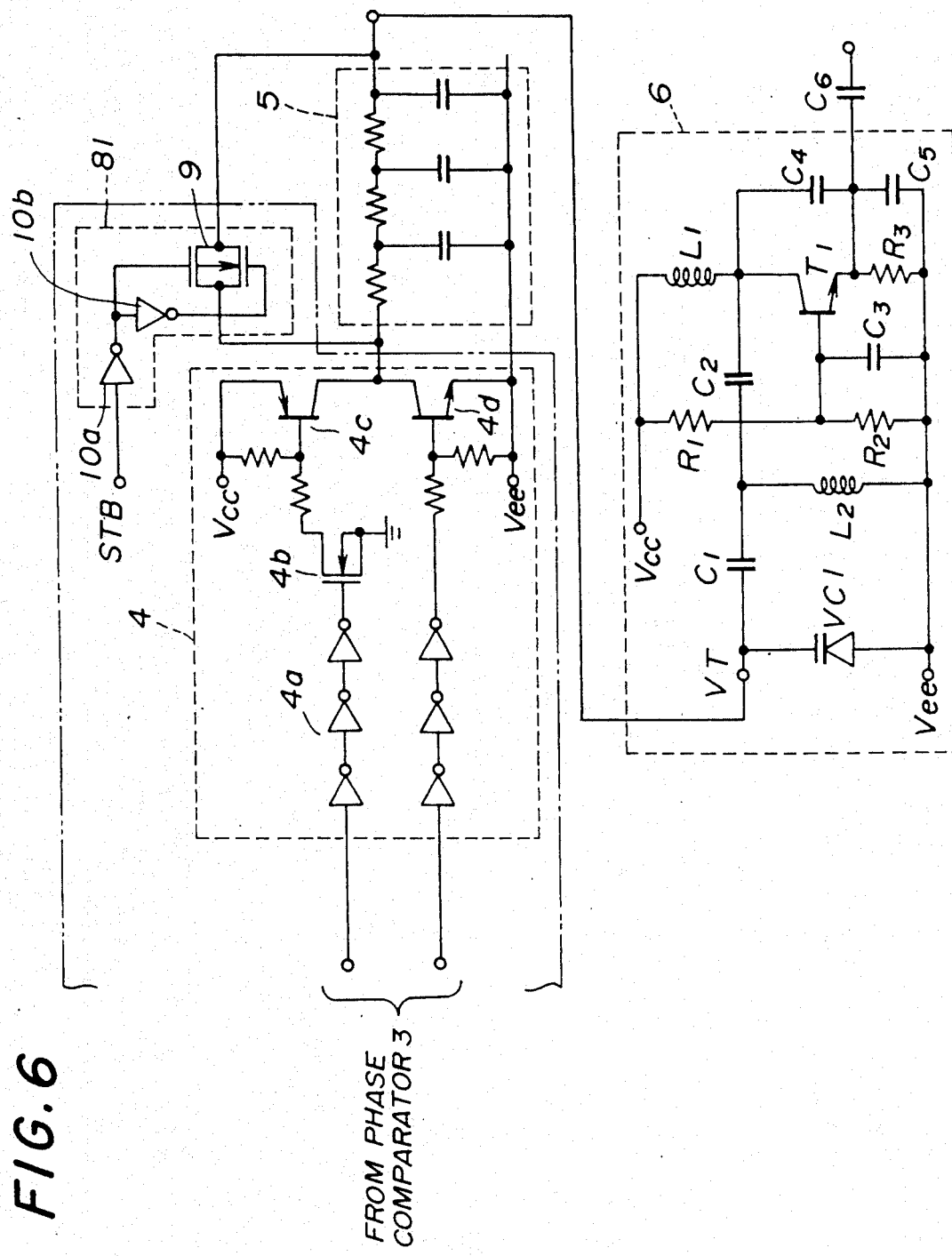
FIG. 6 is a circuit diagram of the configuration shown in FIG. 5.

FIG. 6 is a circuit diagram of the configuration shown in FIG. 5. In FIG. 6, those parts which are the same as those in the previous figures are given the same reference numerals. Referring to FIG. 6, the charge pump circuit 4 includes a group of inverters 4a, a MOS (metal oxide semiconductor) transistor 4b, and two bipolar transistors 4c and 4d. The charge pump circuit 4 follows the phase comparator 3, which follows the PLL operation circuit 1. The PLL operation circuit 1 and the phase comparator 3 are formed using CMOS (complementary metal oxide semiconductor) techniques in a conventional manner.

The analog switch 81 is made up of two inverters 10a, 10b, and a bidirectional transfer gate 9 consisting of two MOS transistors. The strobe signal STB is supplied to the inverter 10a. The output signal of the inverter 10a is supplied to the inverter 10b and one of the two control terminals of the transfer gate 9. The other control terminal of the transfer gate 9 is supplied with the output signal of the inverter 10b. Two signal terminals of the transfer gate 9 are connected to the input and output terminals of the lowpass filter 5.

The lowpass filter 5 consists of resistors and capacitors. The VCO 6 is a Colpitts oscillator, which includes capacitors C3, C4, C5 and a coil L2, and an oscillation transistor T1. Resistors R1 and R2 of the VCO 6 are used for defining a base potential, and a coil L1 is used for generating a collector potential. Capacitors C1 and C2 are used for separating an input terminal voltage VT from the aforementioned collector potential on the DC base. A voltage-controlled capacitor (Varicap) VC1 presents a variable capacitance based on the input terminal voltage VT. A variation in capacitance of the voltage-variable capacitor VC1 causes a change of the oscillation frequency of the Colpitts oscillator. A capacitor C6 is used for drawing the oscillation frequency through an AC coupling.

Figure 7:
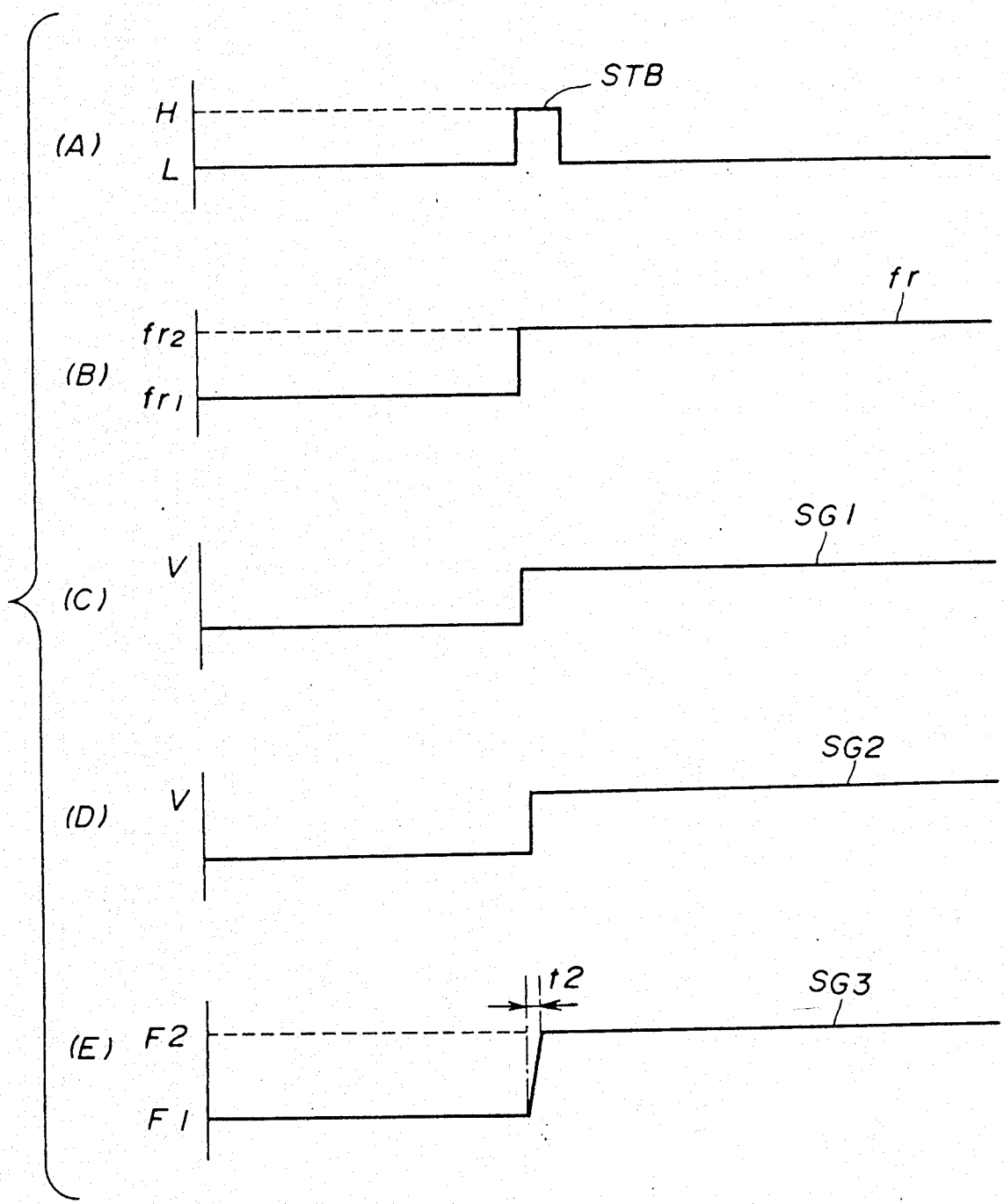
FIG. 7 is a waveform diagram of signals at different parts of the configuration shown in FIGS. 5 and 6.

A description is given of an operation of the embodiment shown in FIGS. 5 and 6 with reference to FIG. 7.

The set frequency data DA is taken in the PLL operation circuit 1 when the strobe signal STB is supplied to the PLL operation circuit 1 as shown in (A) of FIG. 7. At this time, as shown in (B) of FIG. 7, the frequency of the set signal fr1 derived from the PLL operation circuit 1 is increased to the frequency fr2. In response to this change of the frequency of the set signal fr1, as shown in (C) of FIG. 7, the DC level of the signal SG1 is increased due to the function of the phase comparator 3 and the charge pump circuit 4.

At this time, the analog switch 81 is closed by the strobe signal STB so that the output terminal of the charge pump circuit 4 is connected directly to the input terminal of the VCO 6. Thus, the signal SG1 is supplied directly to the VCO 6 through the analog switch 81, so that the signal SG2 increases rapidly as shown in (D) of FIG. 7. As a result of this rapid change of the signal SG2, the frequency of the output signal SG3 is rapidly increased from the frequency F1 to the frequency F2 with a slight lock-up time $t_2$ as shown in (E) of FIG. 7. When the strobe signal STB switches to the low level, the analog switch 81 is made open. Then the signal derived from the charge pump circuit 4 passes through the lowpass filter 5 and is supplied to the VCO 6. Thus, the output signal SG3 derived from the VCO 6 has a high purity, that is, less signal deterioration. It is preferable that the pulse width of the strobe signal STB is longer than the lock-up time.

Figure 8:
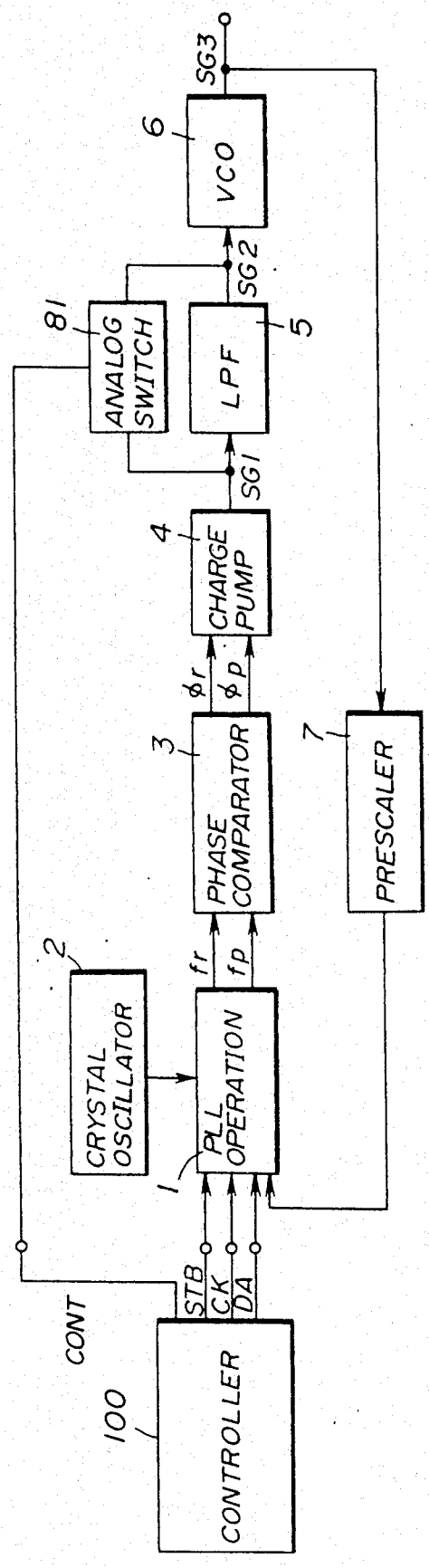
FIG. 8 is a block diagram of a variation of the configuration shown in FIG. 5.

FIG. 8 is a block diagram of a variation of the embodiment shown in FIG. 5. The analog switch 81 of the variation shown in FIG. 8 is supplied with a specific control signal CONT derived from the controller 100 separately from the strobe signal STB. That is, the analog switch 81 used in the variation is controlled by the specific control signal CONT, which rises in synchronism with the strobe signal, for example.

Figure 9:
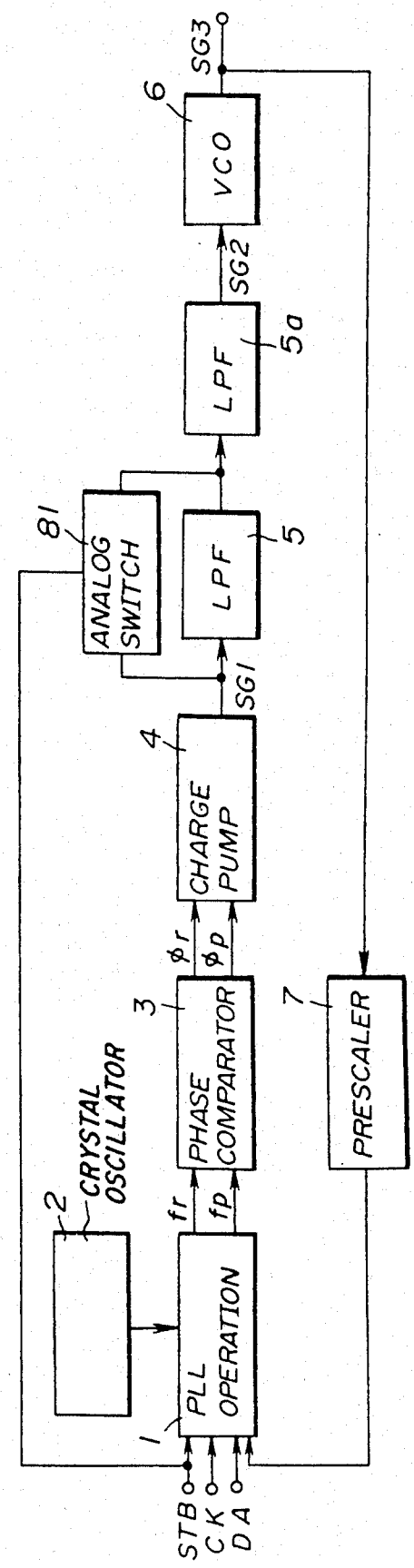
FIG. 9 is a block diagram of a second embodiment of the present invention.

FIG. 9 is a block diagram of a second embodiment of the present invention. In FIG. 9, those parts which are the same as those in the previous figures are given the same reference numerals. The illustrated PLL synthesizer has two lowpass filters 5 and 5a, which are connected in series. The analog switch 81 is connected across the lowpass filter 5. When the analog switch 81 is closed, the signal SG1 of the charge pump circuit 4 is supplied to the lowpass filter 5a through the analog switch 81. The signal SG1 passes through the lowpass filter 5a and is then supplied to the VCO 6. The arrangement shown in FIG. 9 presents almost the same advantages as the arrangement shown in FIG. 5.

Figure 10A:
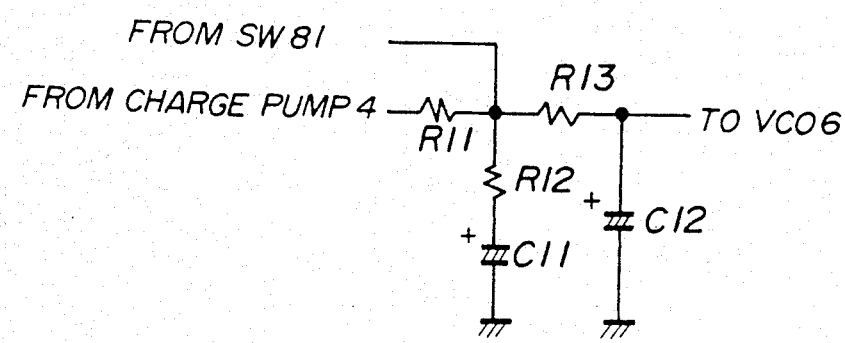
FIG. 10A is a circuit diagram of a configuration of lowpass filters connected in series shown in FIG. 9.

FIG. 10A is a circuit diagram of the lowpass filters 5 and 5a. The lowpass filter 5 is formed by a resistor R11, and the lowpass filter 5a is composed of resistors R12, R13, and capacitors C11 and C12. An end of the resistor R11 is connected to the output terminal of the charge pump circuit 4. The output terminal of the analog switch 81 is connected to a connection node between the resistors R12 and R13. A connection node between the resistor R13 and the capacitor C12 is connected to the input terminal of the VCO 6.

Figure 10B:
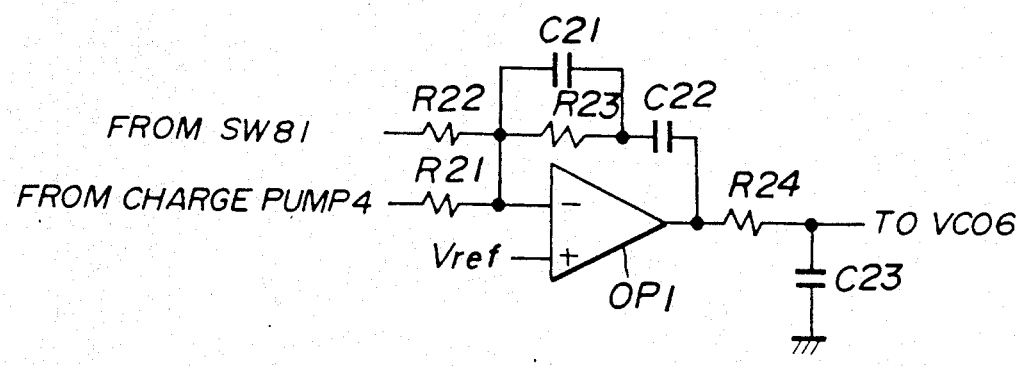
FIG. 10B is a circuit diagram of a different configuration of the lowpass filters shown in FIG. 9.

FIG. 10B is a circuit diagram of a different configuration of the lowpass filters 5 and 5a. The lowpass filter 5 is formed by a resistor R21, and the lowpass filter 5a is composed of resistors R22–R24, capacitors C22, C23 and a differential amplifier OP1. An end of the resistor R21 is connected to the output terminal of the charge pump circuit 4, and the other end thereof is connected to the inverting input terminal of the differential amplifier OP1. The non-inverting input terminal of the differential amplifier OP1 is supplied with a reference voltage Vref. The output terminal of the analog switch circuit 81 is connected to an end of the resistor R22, the other end of which is connected to the inverting input terminal of the differential amplifier OP1. A connection node between the resistor R24 and the capacitor C23 is connected to the input terminal of the VCO 6. The resistor R21 has a resistance of 8 k$\Omega$, and the resistor R22 has a resistance of 1 k$\Omega$, for example.

Figure 11A:
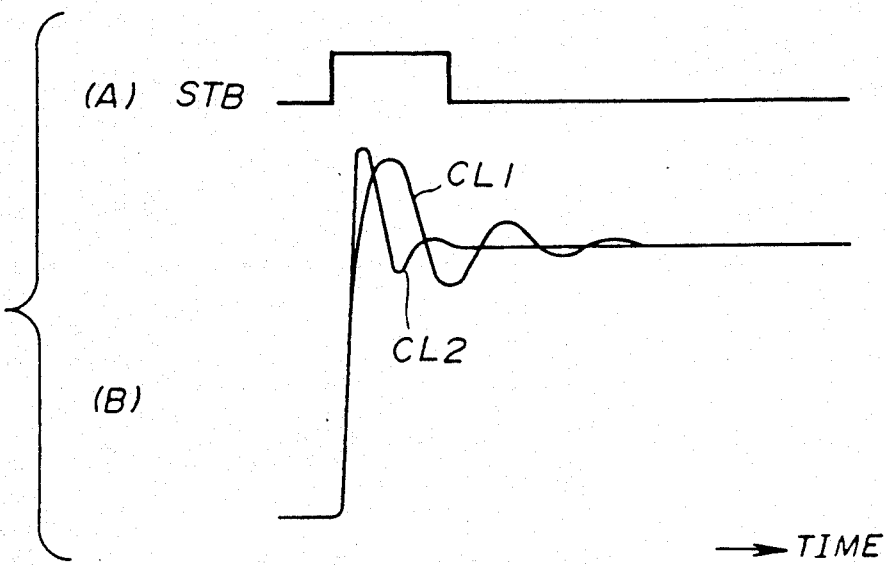
FIGS. 11A and 11B are graphs illustrating the experimental results.
Figure 11B:
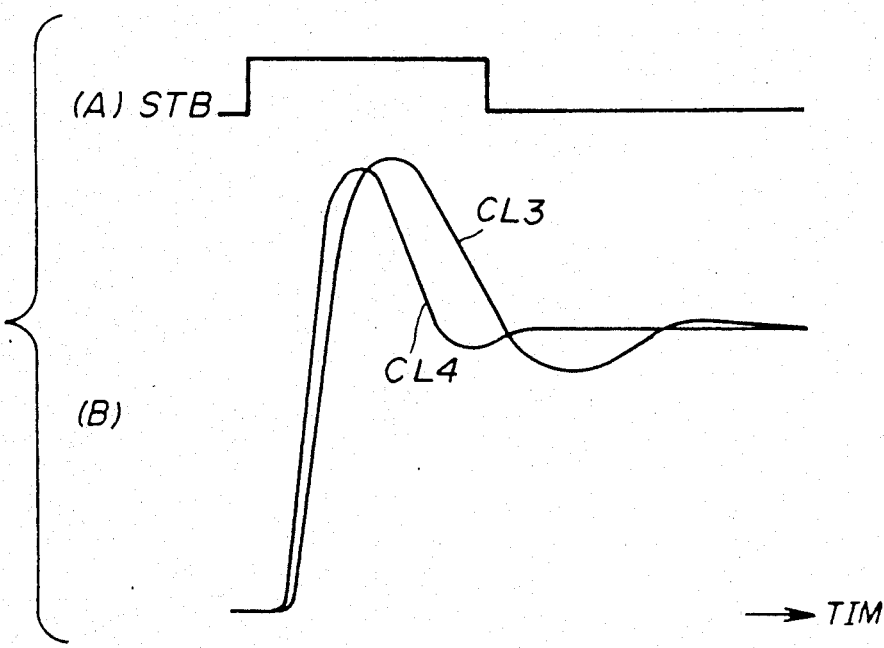

FIG. 11A is a graph illustrating the experimental results obtained when the configuration shown in FIG. 10A is used, and FIG. 11B is a graph illustrating the experimental results obtained when the configuration shown in FIG. 10B is used. In the experiments, the frequency of the VCO 6 was changed from 770 MHz to 814 MHz in response to the strobe signals shown in (A) of FIGS. 11A and 11B. A curve CL1 shown in (B) of FIG. 11A relates to a case where the analog switch 81 is held open independently of the strobe signal (A), and a curve CL2 shown in (B) of FIG. 11A relates to a case where the analog switch 81 is switched in synchronism with the strobe signal STB. It takes 150 ms for the output frequency of the VCO 6 to be settled at 814 MHz in the absence of the analog switch control, whereas it takes 60 ms in the presence of the analog switch control according to the present invention.

A curve CL3 shown in (B) of FIG. 11B relates to a case where the analog switch 81 is held open independently of the strobe signal STB (A), and a curve CL4 shown in (B) of FIG. 11B relates to a case where the analog switch 81 is switched in synchronism with the strobe signal STB. It takes 16 ms for the output frequency of the VCO 6 to be settled at 814 MHz in the absence of the analog switch control, whereas it takes 8 ms in the presence of the analog switch control according to the present invention.

The analog switch 81 shown in FIG. 9 may be controlled by the specific control signal CONT separately from the strobe signal STB in the same way as the configuration shown in FIG. 8. The switch circuit 8 is not limited to the analog switch 81. A mechanical switch or a digital switch may be used. It is preferable that the switch circuit 8 can operate at high speeds.

The present invention is not limited to the aforementioned embodiments, and variations and modifications may be made without departing from the scope of the present invention.

What is claimed is:

1. A PLL synthesizer comprising:
   a voltage-controlled oscillator generating an output signal having a frequency based on a first signal supplied thereto;
   PLL controlling means for generating a second signal based on said output signal and a set frequency changeable in response to a strobe signal supplied from an external circuit;
   lowpass filter means, having an input terminal and an output terminal, for filtering said second signal supplied through said input terminal to thereby generate said first signal supplied to said voltage-controlled oscillator through said output terminal; and
   switch means, coupled between said input and output terminals of said lowpass filter means, for receiving an external signal in synchronism with said strobe signal and for supplying said second signal directly to said voltage-controlled oscillator during a predetermined time in response to said external signal.

so that said second signal is supplied directly to said voltage-controlled oscillator in synchronism with the beginning of a change of the set frequency instructed by said strobe signal.

2. A PLL synthesizer as claimed in claim 1, wherein said switch means includes short-circuiting means for short-circuiting said input and output terminals of said lowpass filter means.

3. A PLL synthesizer as claimed in claim 1, wherein said switch means includes an analog switch.

4. A PLL synthesizer as claimed in claim 3, wherein said analog switch comprises a complementary MOS transfer gate.

5. A PLL synthesizer as claimed in claim 1, further comprising a frequency dividing means for dividing the frequency of said output signal to thereby generate a frequency divided output signal, which is supplied to said PLL controlling means.

6. A PLL synthesizer as claimed in claim 5, wherein said PLL controlling means comprises a crystal oscillator generating a reference signal, PLL operating means for dividing the set frequency by using said reference signal to thereby generate a set signal and for dividing the frequency of said frequency divided output signal by using said reference signal to thereby generate a feedback signal, and signal generating means for generating said second signal which is based on the frequencies of said set signal and said feedback signal as well as the phase difference between said set signal and said feedback signal.

7. A PLL synthesizer as claimed in claim 1, wherein said PLL synthesizer is a digital tuner.

8. A PLL synthesizer as claimed in claim 1, wherein said filter means comprises a resistor.

9. A PLL synthesizer as claimed in claim 1, wherein said filter means comprises a resistor and a capacitor.

10. A PLL synthesizer comprising:
a voltage-controlled oscillator generating an output signal having a frequency based on a first signal supplied thereto;
PLL controlling means for generating a second signal based on said output signal and a set frequency changeable in response to a strobe signal supplied from an external circuit;
first lowpass filter means, having an input terminal and an output terminal, for filtering said second signal supplied through said input terminal to thereby generate a filtered second signal output through said output terminal;
second lowpass filter means for filtering said filtered second signal to thereby generate said first signal; and
switch means, coupled between said input and output terminals of said first lowpass filter means, for receiving an external signal in synchronism with said strobe signal and for supplying said second signal from said PLL controlling means directly to said second lowpass filter means during a predetermined time in response to said external signal, so that said second signal is passed only through said second lowpass filter means to said voltage-controlled oscillator in synchronism with the beginning of a change of said set frequency instructed by said strobe signal.

11. A PLL synthesizer as claimed in claim 10, wherein said switch means includes short-circuiting means for short-circuiting said input and output terminals of said first lowpass filter means.

12. A PLL synthesizer as claimed in claim 10, wherein said switch means includes an analog switch.

13. A PLL synthesizer as claimed in claim 12, wherein said analog switch comprises a complementary metal oxide transfer gate.

14. A PLL synthesizer as claimed in claim 10, further comprising a frequency dividing means for dividing the frequency of said output signal to thereby generate a frequency divided output signal, which is supplied to said PLL controlling means.

15. A PLL synthesizer as claimed in claim 14, wherein said PLL controlling means comprises a crystal oscillator generating a reference signal, PLL operating means for dividing said set frequency by using said reference signal to thereby generate a set signal and for dividing the frequency of said frequency divided output signal by using said reference signal to thereby generate a feedback signal, and signal generating means for generating said second signal which is based on the frequencies of said set signal and said feedback signal as well as the phase difference between said set signal and said feedback signal.

16. A PLL synthesizer as claimed in claim 10, wherein said PLL synthesizer is a digital tuner.

17. A PLL synthesizer as claimed in claim 10, wherein said first filter means comprises a resistor, and said second filter means comprises a resistor and a capacitor.

* * * * *